(12) United States Patent
Matsunami

(10) Patent No.: US 10,600,463 B2
(45) Date of Patent: Mar. 24, 2020

(54) MAGNETIC STORAGE DEVICE HAVING A MEMORY CELL INCLUDING A MAGNETORESISTIVE EFFECT ELEMENT AND A SELECTOR WHICH INCLUDES TITANIUM (TI), GERMANIUM (GE) AND TELLURIUM (TE)

(71) Applicant: TOSHIBA MEMORY CORPORATION, Minato-ku, Tokyo (JP)

(72) Inventor: Junya Matsunami, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/100,157

(22) Filed: Aug. 9, 2018

(65) Prior Publication Data
US 2019/0287592 A1    Sep. 19, 2019

(30) Foreign Application Priority Data
Mar. 13, 2018    (JP) ................. 2018-044949

(51) Int. Cl.
| | |
|---|---|
| G11C 11/16 | (2006.01) |
| H01L 27/22 | (2006.01) |
| H01L 43/02 | (2006.01) |
| H01L 43/08 | (2006.01) |
| H01L 43/10 | (2006.01) |
| H01L 43/12 | (2006.01) |

(52) U.S. Cl.
CPC ........ *G11C 11/1659* (2013.01); *G11C 11/161* (2013.01); *G11C 11/1655* (2013.01); *G11C 11/1657* (2013.01); *G11C 11/1673* (2013.01); *G11C 11/1675* (2013.01); *H01L 27/224* (2013.01); *H01L 43/02* (2013.01); *H01L 43/08* (2013.01); *H01L 43/10* (2013.01); *H01L 43/12* (2013.01)

(58) Field of Classification Search
CPC .............. G11C 11/1659; G11C 11/161; G11C 11/1655; G11C 11/1657; G11C 11/1673; G11C 11/1675; H01L 27/224; H01L 43/08; H01L 43/12
See application file for complete search history.

(56) References Cited

U.S. PATENT DOCUMENTS

| | | | |
|---|---|---|---|
| 5,825,046 | A | 10/1998 | Czubatyj et al. |
| 6,373,111 | B1 | 4/2002 | Zheng et al. |
| 9,425,237 | B2 | 8/2016 | Jo |
| 9,812,499 | B1 | 11/2017 | Satoh et al. |

(Continued)

FOREIGN PATENT DOCUMENTS

| | | |
|---|---|---|
| JP | 2014049497 A | 3/2014 |
| TW | 201633507 A | 9/2016 |

(Continued)

OTHER PUBLICATIONS

Maki Sakurai, "XAFS analysis of amorphous material," Synchrotron radiation vol. 15, No. 3 (2002).

*Primary Examiner* — Gene N Auduong
(74) *Attorney, Agent, or Firm* — Holtz, Holtz & Volek PC

(57) ABSTRACT

According to one embodiment, a magnetic device includes a first memory cell including a magnetoresistive effect element and a selector, the selector including titanium (Ti), germanium (Ge) and tellurium (Te).

20 Claims, 13 Drawing Sheets

(56) References Cited

U.S. PATENT DOCUMENTS

| | | | |
|---|---|---|---|
| 10,475,995 B2* | 11/2019 | Fantini | G11C 13/0004 |
| 2007/0223150 A1* | 9/2007 | Fukuzawa | B82Y 25/00 |
| | | | 360/324.11 |
| 2007/0241410 A1* | 10/2007 | Umehara | B82Y 10/00 |
| | | | 257/379 |
| 2007/0242505 A1* | 10/2007 | Ochiai | G11C 11/14 |
| | | | 365/171 |
| 2014/0063924 A1 | 3/2014 | Nakai et al. | |
| 2015/0137290 A1* | 5/2015 | Kajiyama | G11C 11/16 |
| | | | 257/421 |
| 2016/0163975 A1 | 6/2016 | Petz et al. | |
| 2016/0181320 A1 | 6/2016 | Kim | |
| 2016/0204343 A1 | 7/2016 | Gotti et al. | |

FOREIGN PATENT DOCUMENTS

| | | |
|---|---|---|
| TW | 201633526 A | 9/2016 |
| TW | 201724594 A | 7/2017 |

* cited by examiner

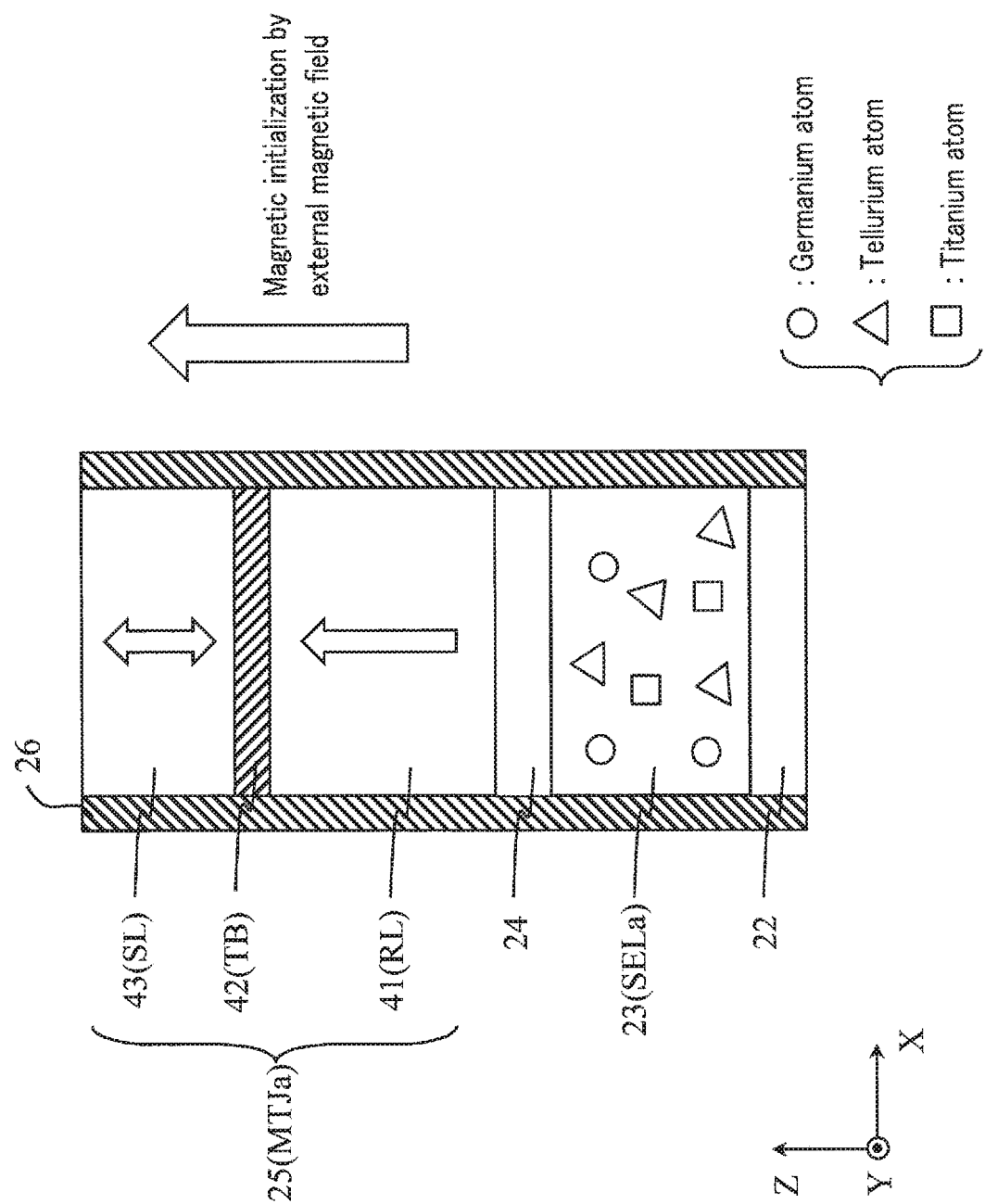
F I G. 10

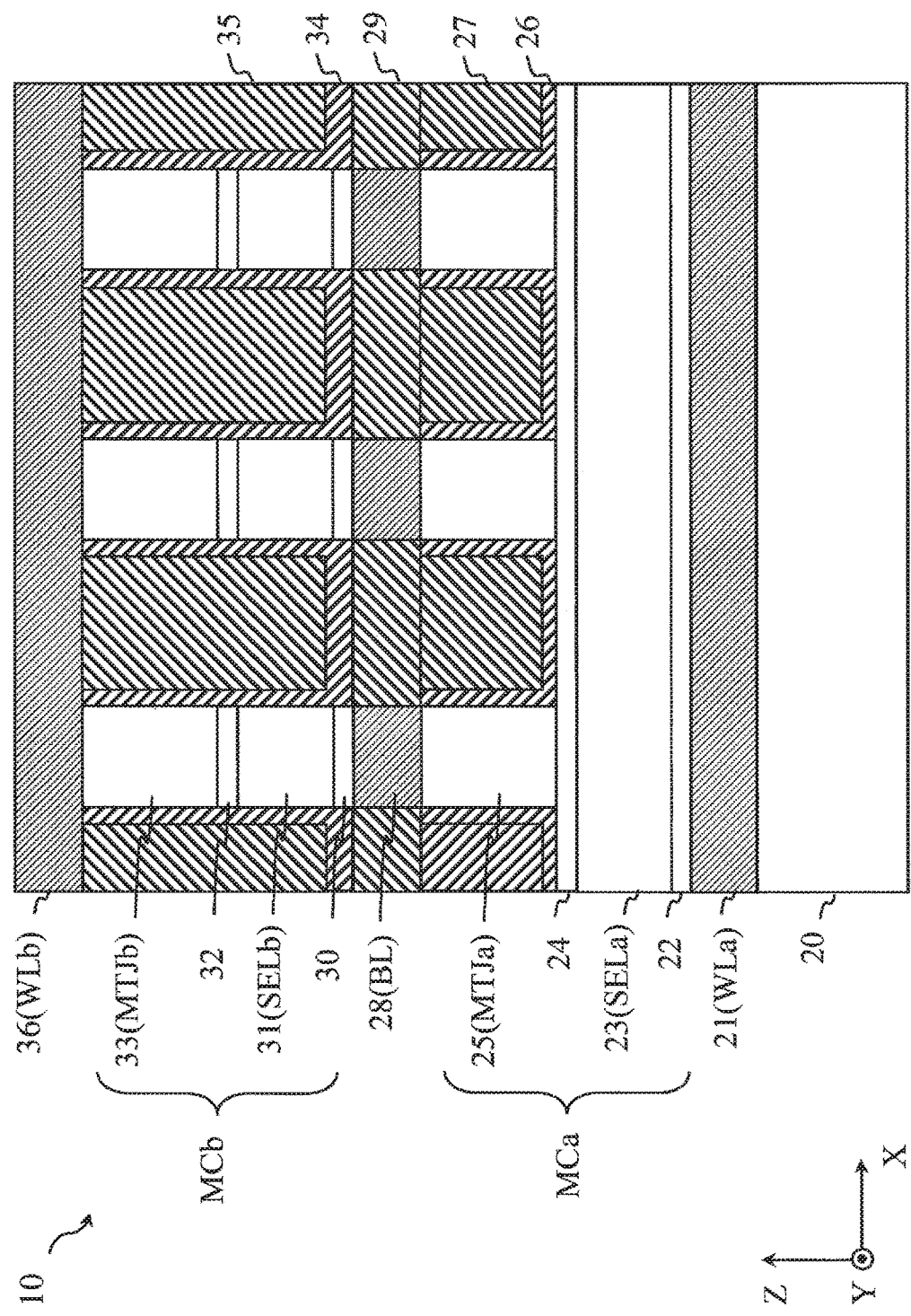
F I G. 12

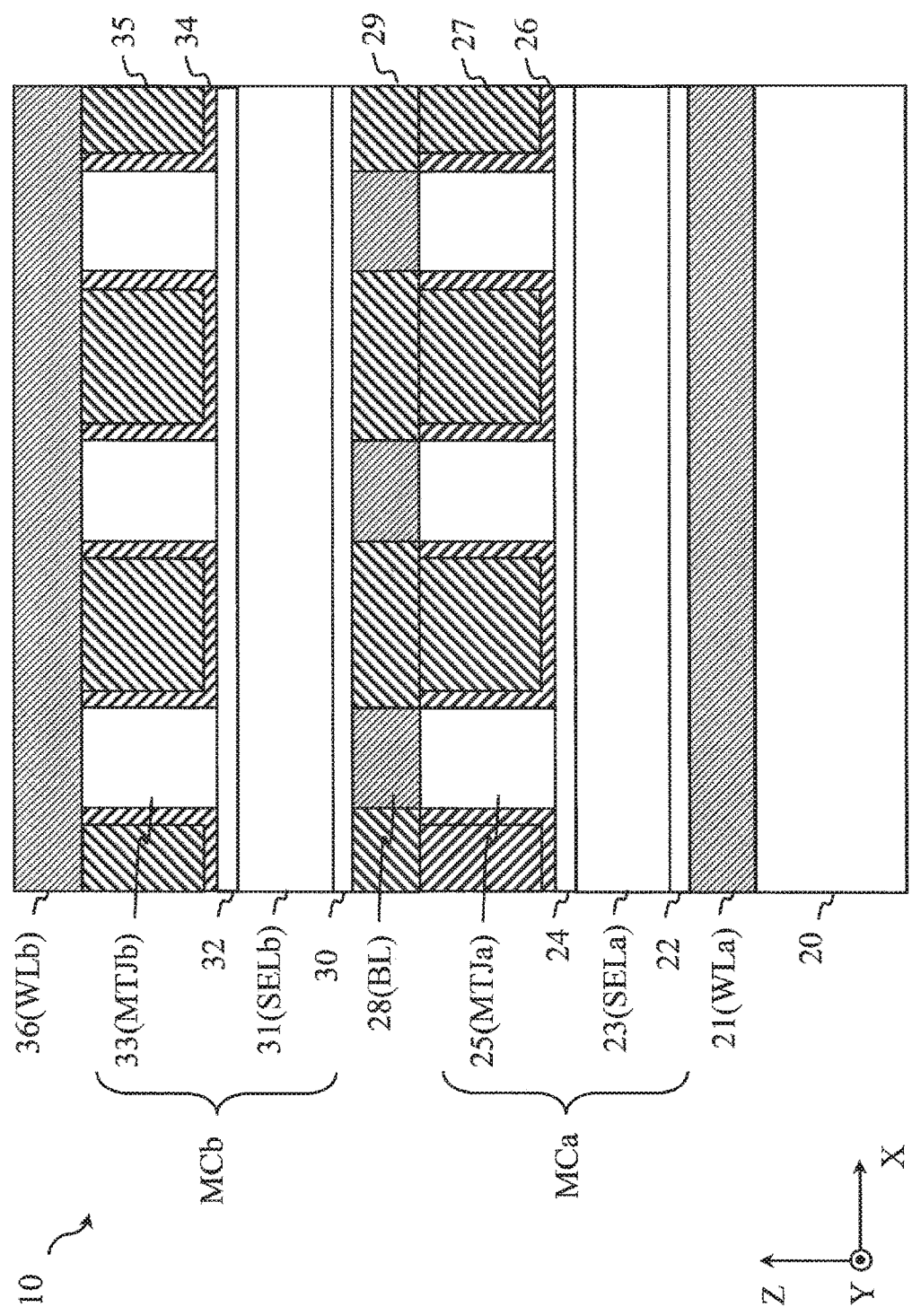
F I G. 13

US 10,600,463 B2

MAGNETIC STORAGE DEVICE HAVING A MEMORY CELL INCLUDING A MAGNETORESISTIVE EFFECT ELEMENT AND A SELECTOR WHICH INCLUDES TITANIUM (TI), GERMANIUM (GE) AND TELLURIUM (TE)

CROSS-REFERENCE TO RELATED APPLICATIONS

This application is based upon and claims the benefit priority from Japanese Patent Application No. 2018-044949, filed Mar. 13, 2018, the entire contents of which are incorporated herein by reference.

FIELD

Embodiments described herein relate generally to a magnetic storage device.

BACKGROUND

There is known a magnetic storage device (MRAM: Magnetoresistive Random Access Memory) using a magnetoresistive effect element as a storage element.

BRIEF DESCRIPTION OF THE DRAWINGS

FIG. 10 is a schematic diagram for describing the manufacturing method of the memory cell of the magnetic storage device according to the first embodiment.

FIG. 12 is a cross-sectional view for describing the configuration of a memory cell array of a magnetic storage device according to a second embodiment.

FIG. 13 is a cross-sectional view for describing the configuration of a memory cell array of a magnetic storage device according to a third embodiment.

DETAILED DESCRIPTION

Figure 1:
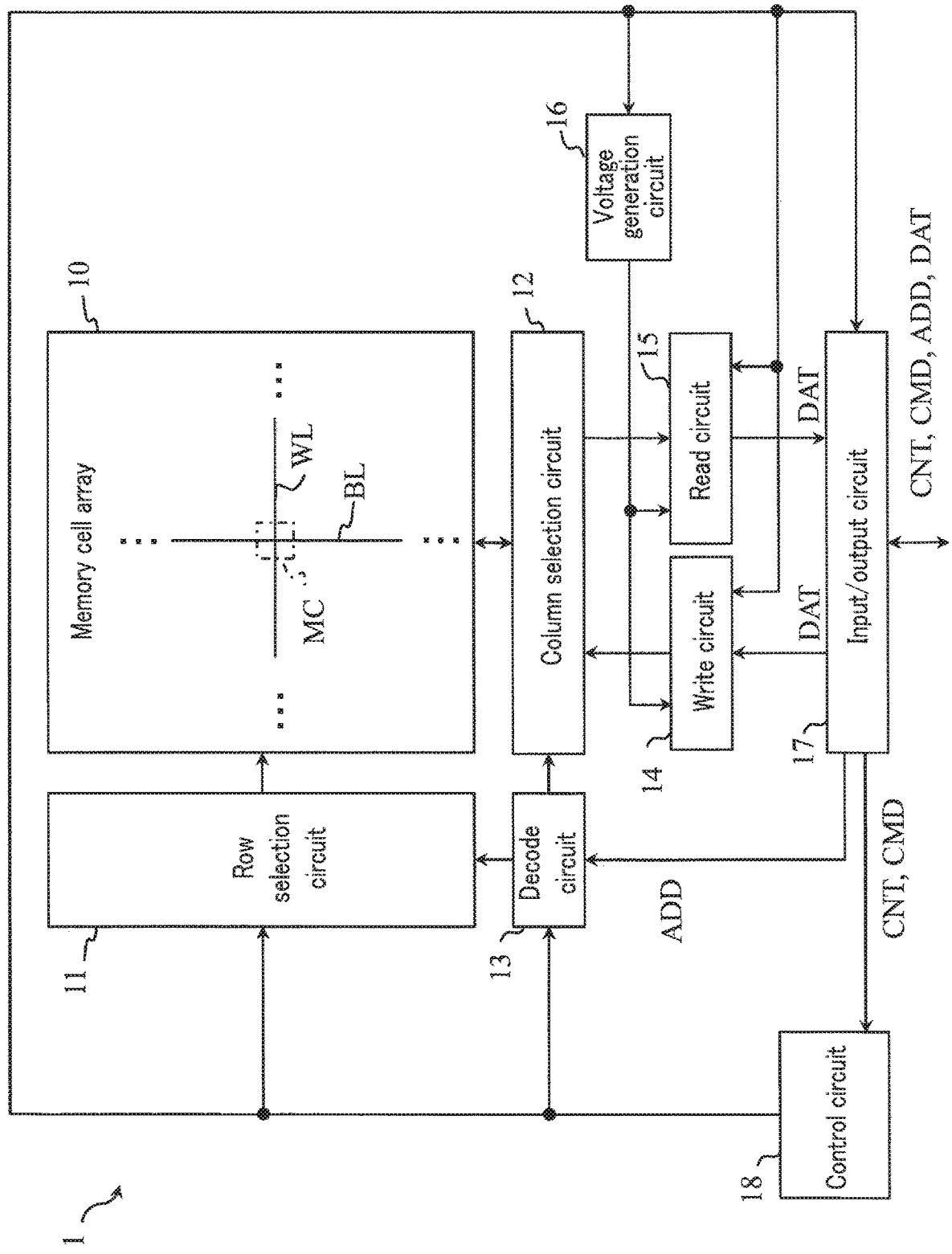
FIG. 1 is a block diagram for describing the configuration of a magnetic storage device according to a first embodiment.

In general, according to one embodiment, a magnetic storage device includes a first memory cell including a magnetoresistive effect element and a selector, the selector including titanium (Ti), germanium (Ge) and tellurium (Te).

Embodiments will be described below with reference to the accompanying drawings. Note that in the following description, common reference numerals denote components having the same functions and arrangements. To discriminate between a plurality of components having a common reference numeral, subscripts are added to the common reference numeral. Note that if it is not necessary to specifically discriminate between the plurality of components, the common reference numeral without any subscripts denotes the plurality of components.

1. First Embodiment

A magnetic storage device according to a first embodiment will be described. The magnetic storage device according to the first embodiment is, for example, a magnetic storage device by a perpendicular magnetization method, which uses a magnetoresistive effect (MTJ: Magnetic Tunnel Junction) element as a storage element.

1.1 Configuration

To begin with, a configuration of the magnetic storage device according to the first embodiment will be described.

1.1.1 Configuration of Magnetic Storage Device

FIG. 1 is a block diagram showing the configuration of the magnetic storage device according to the first embodiment. As shown in FIG. 1, a magnetic storage device 1 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC which are associated with rows and columns. Specifically, memory cells MC on an identical row are coupled to an identical word line WL, and memory cells MC on an identical column are coupled to an identical bit line BL.

The row selection circuit 11 is coupled to the memory cell array 10 via word lines WL. A decode result (row address) of an address ADD from the decode circuit 13 is supplied to the row selection circuit 11. The row selection circuit 11 sets a word line WL, which corresponds to a row based on the decode result of the address ADD, in a selected state. Hereinafter, the word line WL that is set in the selected state is referred to as "selected word line WL". In addition, word lines WL other than the selected word line WL are referred to as "unselected word lines WL".

The column selection circuit 12 is coupled to the memory cell array 10 via bit lines BL. A decode result (column address) of an address ADD from the decode circuit 13 is supplied to the column selection circuit 12. The column selection circuit 12 sets a column, which is based on the decode result of the address ADD, in a selected state. Hereinafter, the bit line BL that is set in the selected state is referred to as "selected bit line BL". In addition, bit lines BL other than the selected bit line BL are referred to as "unselected bit lines BL".

The decode circuit 13 decodes addresses from the input/output circuit 17. The decode circuit 13 supplies the decode results of the addresses ADD to the row selection circuit 11 and column selection circuit 12. The addresses ADD include a column address and a row address which are to be selected.

The write circuit 14 executes write of data to the memory cells C. The write circuit 14 includes, for example, a write driver (not shown).

The read circuit 15 executes read of data from the memory cells MC. The read circuit 15 includes, for example, a sense amplifier (not shown).

The voltage generation circuit 16 generates voltages for various operations of the memory cell array 10, by using a power supply voltage which is disposed from the outside (not shown) of the magnetic storage device 1. For example, the voltage generation circuit 16 generates various voltages which are necessary at a time of a write operation, and outputs the voltages to the write circuit 14. In addition, for example, the voltage generation circuit 16 generates various voltages which are necessary at a time of a read operation, and outputs the voltages to the read circuit 15.

The input/output circuit 17 transfers the address ADD from the outside of the magnetic storage device 1 to the decode circuit 13. The input/output circuit 17 transfers a command CMD from the outside of the magnetic storage device 1 to the control circuit 18. The input/output circuit 17 transmits and receives various control signals CNT between the outside of the magnetic storage device 1 and the control circuit 18. The input/output circuit 17 transfers data DAT from the outside of the magnetic storage device 1 to the write circuit 14, and outputs data DAT, which is transferred from the read circuit 15, to the outside of the magnetic storage device 1.

The control circuit 18 controls, based on the control signals CNT and commands CMD, the operations of the row selection circuit 11, column selection circuit 12, decode circuit 13, write circuit 14, read circuit 15, voltage generation circuit 16 and input/output circuit 17 in the magnetic storage device 1.

1.1.2 Configuration of Memory Cell Array

Figure 2:
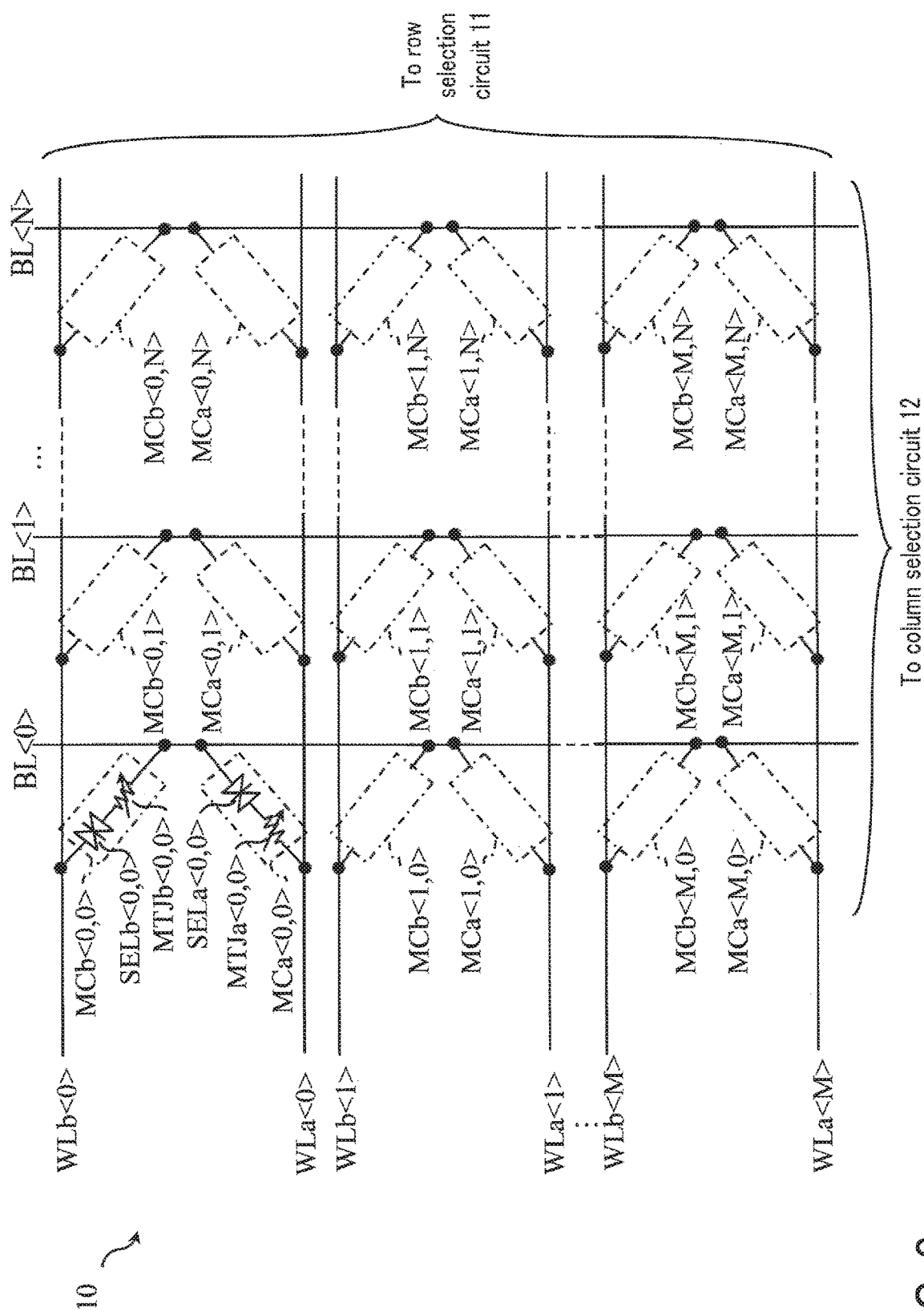
FIG. 2 is a circuit diagram for describing the configuration of a memory cell array of the magnetic storage device according to the first embodiment.

Next, the configuration of the memory cell array of the magnetic storage device according to the first embodiment will be described with reference to FIG. 2. FIG. 2 is a circuit diagram showing the configuration of the memory cell array of the magnetic storage device according to the first embodiment. In FIG. 2, the word lines WL are categorized into two kinds (WLa and WLb) and illustrated.

As shown in FIG. 2, the memory cells MC (MCa and MCb) are arranged. In a matrix in the memory cell array 10, and each memory cell MC is associated with a pair of one of a plurality of bit lines BL (BL<0>, BL<1>, ..., BL<N>) and one of a plurality of word lines WLa (WLa<0>, WLa<1>, ..., WLa<M>) and WLb (WLb<0>, WLb<1>, ..., WLb<M>) (M and N are arbitrary integers). Specifically, a memory cell MCa<i, j> ($0 \leq i \leq M$, $0 \leq j \leq N$) is coupled between a word line WLa<i> and a bit line BL<j>, and a memory cell MCb<i,j> is coupled between a word line WLb<i> and a bit line BL<j>.

Note that subscripts "a" and "b" distinguish, for the purpose of convenience, for example, a component disposed below the bit line BL, and a component disposed above the bit line BL. An example of a three-dimensional configuration of the memory cell array 10 will be described later.

The memory cell MCa<i,j> includes a selector SELa<i,j> and a magnetoresistive effect element MTJa<i,j> which are coupled in series. The memory cell MCb<i,j> includes a selector SELb<i,j> and a magnetoresistive effect element MTJb<i,j> which are coupled in series.

The selector SEL has a function of a switch which controls the supply of current to the corresponding magnetoresistive effect element MTJ at times of data write and data read to and from the magnetoresistive effect. element MTJ.

To be more specific, for example, the selector SEL in a certain memory cell MC shuts off (sets in an OFF state) an electric current as an insulator with a high resistance value when the voltage applied to the memory cell MC is lower than a threshold voltage Vth, and passes (sets in an ON state) an electric current as a conductor with a low resistance value when the voltage applied to the memory cell MC is higher than the threshold voltage Vth. In other words, the selector SEL has a function of effecting switching between the conduction of current and the shutoff of current in accordance with the magnitude of the voltage applied to the memory cell MC, regardless of the direction of a flowing electric current.

The magnetoresistive effect element MTJ can switch the resistance value between a low resistance state and a high resistance state by the current, the supply of which is controlled by the selector SEL. The magnetoresistive effect element MTJ can write data by the change of the resistance state thereof, and functions as a storage element which can nonvolatilely store the written data and can read the data.

Figure 3:
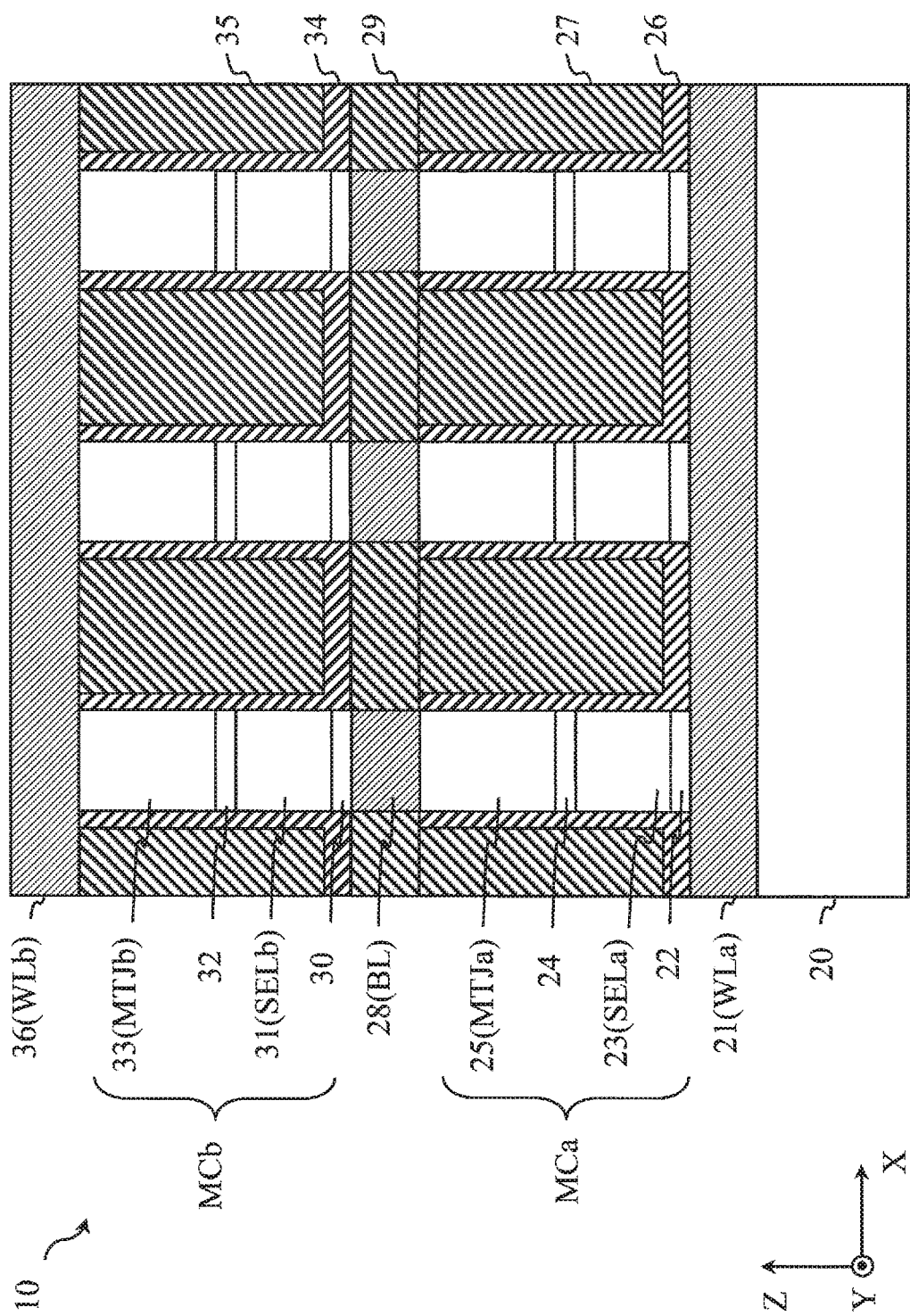
FIG. 3 is a cross-sectional view for describing the configuration of the memory cell array of the magnetic storage device according to the first embodiment.

Next, a cross-sectional configuration of the memory cell array 10 will be described with reference to FIG. 3. FIG. 3 illustrates an example of a cross-sectional configuration, taken along the word lines, of the memory cell array of the magnetic storage device according to the first embodiment.

As shown in FIG. 3, the magnetic storage device 1 is disposed on a semiconductor substrate 20. In the description below, a plane parallel to the surface of the semiconductor substrate 20 is defined as an XY plane, and a direction perpendicular to the XY plane is defined as a Z direction. In addition, a direction along the word line WL is defined as an X direction, and a direction along the bit line BL is defined as a Y direction. The X direction and Y direction are, for example, perpendicular to each other in the XY plane.

For example, a plurality of conductors 21 functioning as word lines WLa are disposed on the upper portion of the semiconductor substrate 20. The conductors 21 are arranged, for example, in the Y direction, and extend in the X direction. On that region of the semiconductor substrate 20, on which the conductors 21 are not disposed, an insulator (not shown), for example, is disposed up to the height of the conductors 21.

A plurality of barrier materials 22, which prevent diffusion of the material included in the selector SELa, are disposed on the upper portions of the conductors 21. The barrier material 22 includes, for example, carbon (C). The barrier materials 22 arranged in the X direction are commonly coupled to one conductor 21. An element 23 functioning as the selector SELa is disposed on the upper portion of each of the barrier materials 22.

The element 23 may be, for example, a two-terminal (binary) switching element. When a voltage that is applied between a pair of terminals is less than a threshold voltage, the switching element can remain in a "high resistance" state, e.g., an electrically non-conductive state. When the voltage applied between the pair of terminals is equal to or greater than the threshold voltage, the switching element can turn into a "low resistance" state, e.g., an electrically conductive state. The switching element may have this function in both polarity of the voltage. The element 23 may include a chalcogenide material. To be more specific, the element 23 includes titanium (Ti)-doped germanium telluride (GeTe). In the description below, for the purpose of convenience, the term "titanium (Ti)-doped germanium telluride (GeTe)" is also expressed as "titanium-doped germanium telluride (TiGeTe)". In addition, the element 23 has an amorphous structure in a normal state (for example, a state in which no voltage is applied). The element 23 may also include at least one or more elements selected from the group of boron (B), aluminum (Al), gallium (Ga), indium (In), carbon (C), silicon (Si), germanium (Ge), tin (Sn), arsenic (As), phosphorus (P) and antimony (Sb).

An atomic ratio of germanium (Ge) included in the element 23 is, for example, preferably 5 to 30 at %, and is more preferably 10 to 20 at %. Thereby, the element 23 can have current-voltage characteristics as the selector SEL which can properly select the magnetoresistive effect element MTJ. In addition, the atomic ratio of titanium (Ti) included in the element 23 is, for example, preferably 2 to 10 at %, and is more preferably 4 to 8 at %. Thereby, the element 23 can have such thermal characteristics that even if the element 23 is heated by an annealing process at a time of fabricating the magnetoresistive effect element MTJ, the element 23 does not lose the function of the two-terminal switching element (the selector SEL is riot destroyed). Note that the atomic ratio of the element 23 can be measured by using, for example, a scanning transmission electron microscope-energy dispersive X-ray spectrometry (STEM-EDX). The details of the concrete characteristics of the element 23 will be described later.

A barrier material 24, which prevents diffusion of the material included in the selector SELa, is disposed on the upper portion of each of the elements 23. Like the barrier material 22, the barrier material 24 includes, for example, carbon (C). An element 25 functioning as the magnetoresistive effect element MTJa is disposed on the upper portion of each of the barrier material 24. The details of the element 25 will be described later.

For example, an insulator 26 is disposed on that surface of the upper part of the conductor 21, on which the barrier materials 22 are not disposed, and on side surfaces of the barrier material 22, element 23, barrier material 24 and element 25 which are stacked in the named order in the direction. The insulator 26 has a function of preventing diffusion of the material included in the selector SELa, and includes, for example, silicon nitride (SiN). Note that the method of providing the insulator 26 is not, limited to a method of providing a layer of silicon nitride (SiN). The insulator 26 may be disposed by a method of nitriding the side surfaces of the respective layers. For example, an insulator 27 is disposed on the insulator 26 up to the height of the elements 25. The insulator 27 includes, for example, silicon dioxide (SiO2).

A conductor 28 functioning as the bit line BL is disposed on the upper part of each of the elements 25. For example, the conductors 28 are arranged in the X direction, and extend in the Y direction. Each of the conductors 28 arranged in the X direction is commonly coupled to the elements 25 (some of which are not shown) arranged in the Y direction. For example, on those regions of the insulators 26 and 27, on which the conductors 28 are not disposed, for example, an insulator 29 is disposed up to the height of the conductors 28.

A plurality of barrier materials 30, which prevent diffusion of the material included in the selectors SELb, are disposed on the each of the conductors 28. The barrier materials 30 arranged in the Y direction are commonly coupled to one conductor 28. The barrier material 30 includes, for example, carbon (C). An element 31 functioning as the selector SELb is disposed on the upper portion of each of the barrier materials 30. Like the above-described element 23, the element 31 includes, for example, titanium-doped germanium telluride (TiGeTe). A barrier material 32, which prevents diffusion of the material included in the selector SELb, is disposed on the upper portion of each of the elements 31. Like the barrier material 30, the barrier material 32 includes, for example, carbon (C). An element 33 functioning as the magnetoresistive effect element MTJb is disposed on the upper portion of each of the barrier materials 32. The details of the element 33, along with the element 25, will be described later.

For example, an insulator 34 is disposed on that surface of the upper portion of the conductor 28, on which the barrier materials 30 are not disposed, as well as on the upper portion of the insulator 29, and on side surfaces of the barrier material 30, element 31, barrier material 32 and element 33 which are stacked in the named order in the Z direction. The insulator 34 has a function of preventing diffusion of the material included in the selector SELb, and includes, for example, silicon nitride (SiN), like the insulator 26. An insulator 35 is disposed on the insulator 34 up to the height of the elements 33. The insulator 35 includes, for example, silicon dioxide (SiO2), like the insulator 27.

A conductor 36 functioning as the word line WLb is disposed on the upper part of each of the elements 33. For example, the conductors 36 are arranged in the Y direction, and extend in the X direction. Each of the conductors 36 arranged in the Y direction is commonly coupled to the elements 33 arranged in the X direction. For example, on those regions of the upper surfaces of the insulators 34 and 35, on which the conductors 36 are not disposed, for example, an insulator (not shown) is disposed up to the height of the conductors 36.

By the above configuration, the memory cell array 10 has a structure (stacked cross-point structure) in which cross-point structures, each being able to select one memory cell MC by a pair of one bit line BL and one word line WL, are stacked in the Z direction.

1.1.3 Configuration of Magnetoresistive Effect Element

Figure 4:
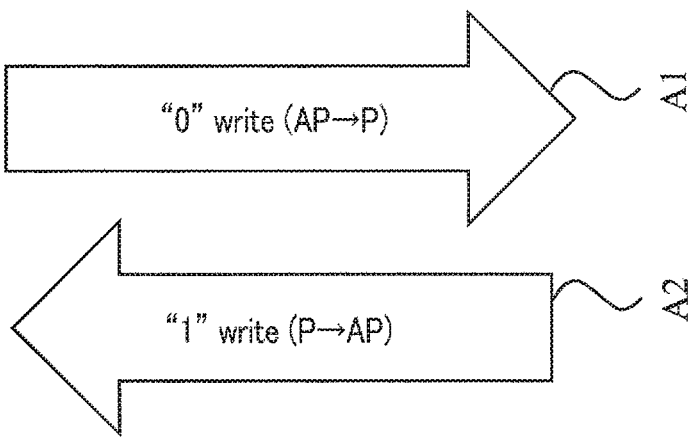
FIG. 4 is a cross-sectional view for describing the configuration of a magnetoresistive effect element of the magnetic storage device according to the first embodiment.
Figure 4:
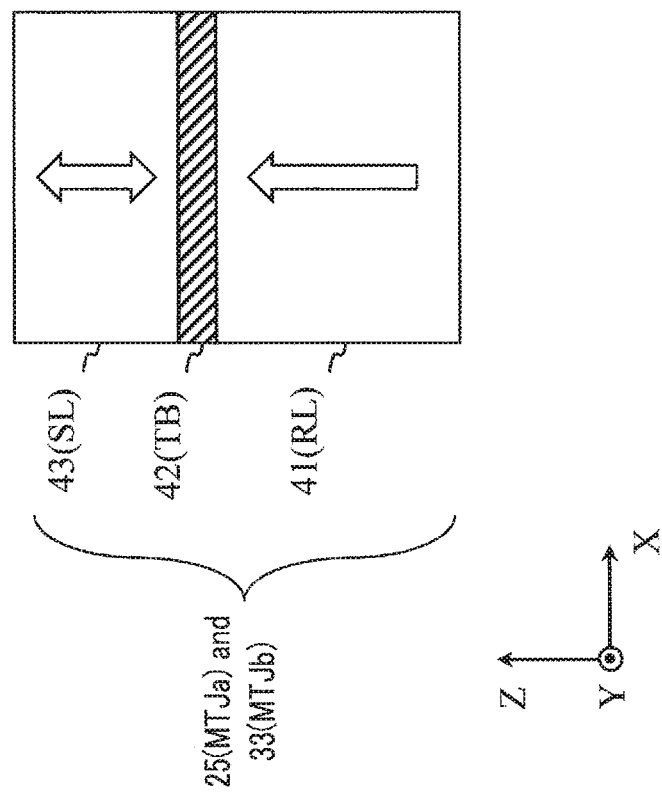

Next, the configuration of the magnetoresistive effect element of the magnetic storage device according to the first embodiment will be described with reference to FIG. 4. FIG. 4 is an example of a cross-sectional view, taken along an XZ plane, of the magnetoresistive effect element of the magnetic storage device according to the first embodiment.

As shown in FIG. 4, each of the elements 25 and 33 includes a ferromagnetic material 41 functioning as a reference layer RL, a nonmagnetic material 42 functioning as a tunnel barrier layer TB, and a ferromagnetic material 43 functioning as a storage layer SL. The ferromagnetic material 41, nonmagnetic material 42 and ferromagnetic material 43 constitute a magnetic tunnel junction.

In the element 25, for example, from the word line WLa side toward the bit line BL side (in the Z-axis direction), a plurality of materials are stacked in the order of the ferromagnetic material 41, nonmagnetic material 42 and ferromagnetic material 43. In the element 33, for example, from the bit line BL side toward the word line WLb side (in the Z-axis direction), a plurality of materials are stacked in the order of the ferromagnetic material 41, nonmagnetic material 42 and ferromagnetic material 43. The elements 25 and 33 function as perpendicular magnetization-type MTJ elements in which, for example, the magnetization direction of each of the ferromagnetic materials 41 and 43 is perpendicular to the film plane.

The ferromagnetic material 41 has ferromagnetism and has the axis of easy magnetization in a direction perpendicular to the film plane. The ferromagnetic material 41 has a magnetization direction toward either the bit line EL side or the word line WL side. The ferromagnetic material 41 includes, for example, cobalt-platinum (CoPt), cobalt-nickel (CoNi) or cobalt-palladium (CoPd). The magnetization direction of the ferromagnetic material 41 is fixed and, in the example of FIG. 4, this direction is directed toward the ferromagnetic material 43. Note that the expression "the magnetization direction of the ferromagnetic material 41 is fixed" means that this magnetization direction does not change by a current (spin torque) of a magnitude which can reverse the magnetization direction of the ferromagnetic material 43.

The nonmagnetic material 42 is a nonmagnetic insulation film and includes, for example, magnesium oxide (MgO).

The ferromagnetic material 43 has ferromagnetism and has the axis of easy magnetization in a direction perpendicular to the film plane. The ferromagnetic material 43 has a magnetization direction toward either the bit line BL side or the word line WL side. The ferromagnetic material 43 includes, for example, cobalt-iron-boron (CoFeB) or iron boride (FeB).

In the present embodiment, a spin-transfer writing method is adopted. In this method, a write current is directly passed through this magnetoresistive effect element MTJ, a spin torque is injected in the storage layer SL by the write current, and the magnetization direction of the storage layer SL is controlled. The magnetoresistive effect element MTJ can take either a low resistance state or a high resistance state, depending on whether the relative relationship between the magnetization directions of the storage layer SL and reference layer RL is parallel or antiparallel.

If a write current of a certain magnitude is caused to flow through the magnetoresistive effect element MTJ in a direction of arrow A1 in FIG. 4, i.e. in a direction from the storage layer SL toward the reference layer RL, the relative relationship between the magnetization directions of the storage layer SL and reference layer RL becomes parallel. In the case of this parallel state, the resistance value of the magnetoresistive effect element MTJ lowers, and the magnetoresistive effect element MTJ is set in the low resistance state. This low resistance stat called "P (Parallel) state", and is defined, for example, as the state of data "0".

On the other hand, if a write current, which is greater than the write current at the time of writing data "0", is caused to flow through the magnetoresistive effect element MTJ in a direction of arrow A2 in FIG. 4, i.e. in a direction from the reference layer RL toward the storage layer SL, the relative relationship between the magnetization directions of the storage layer SL and reference layer RL becomes antiparallel. In the case of this antiparallel state, the resistance value of the magnetoresistive effect element MTJ increases, and the magnetoresistive effect element MTJ is set in the high resistance state. This high resistance state is called "AP (Anti-Parallel) state", and is defined, for example, as the state of data "1".

Note that the description below is based on the above-described method of defining data, but the method of defining data "1" and "0" is not limited to the above example. For example, the P state may be defined as data "1", and the AP state may be defined as data "0".

1.1.4 Current-Voltage Characteristics of Memory Cell

Next, referring to FIG. 5, the current-voltage characteristics (also referred to as "IV characteristics") of the memory cell of the magnetic storage device according to the first embodiment will be described.

Figure 5:
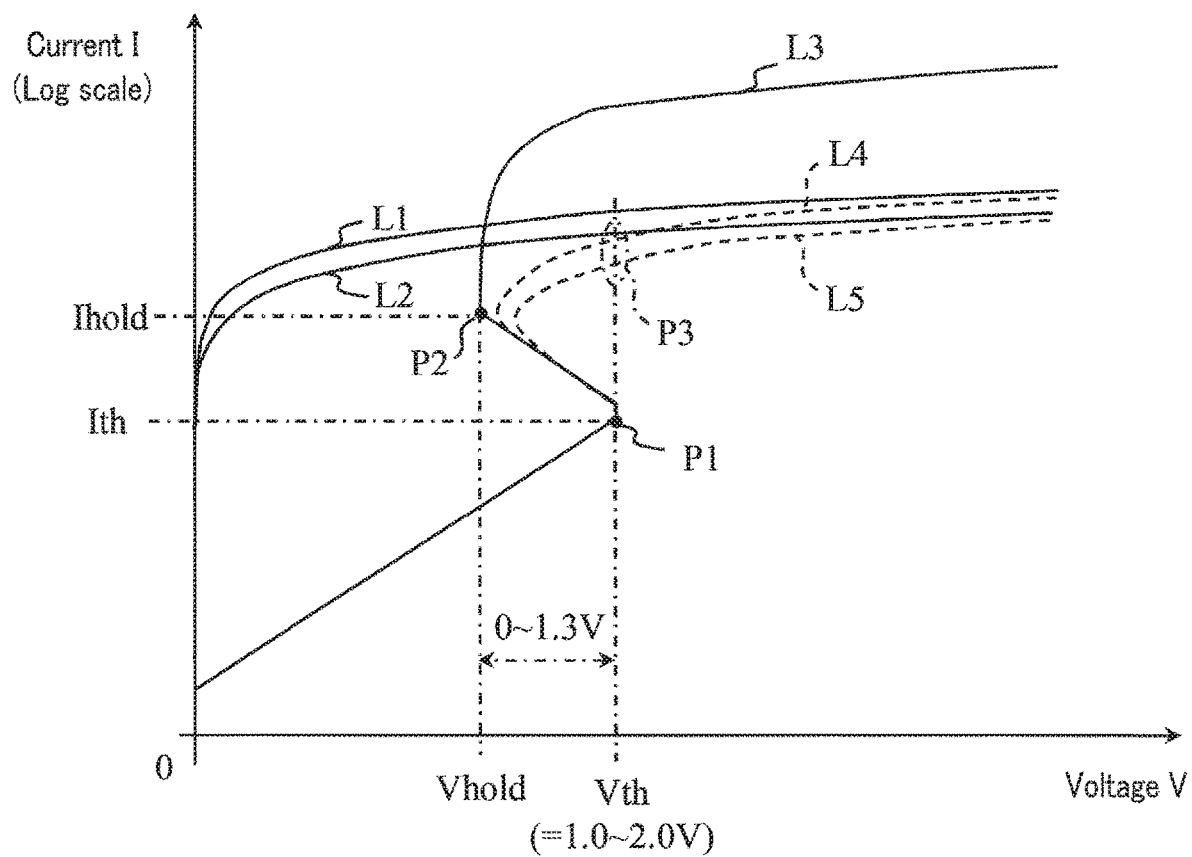
FIG. 5 is a diagram for describing characteristics of a memory cell of the magnetic storage device according to the first embodiment.

FIG. 5 is a diagram for describing the IV characteristics of the memory cell of the magnetic storage device according to the first embodiment. FIG. 5 shows the IV characteristics of the memory cell MC, or the IV characteristics of the selector SEL and magnetoresistive effect element MTJ as single units which constitute the memory cell MC, when the abscissa axis indicates voltage V and the ordinate axis indicates current I. Note that the current I of the ordinate axis is expressed as logarithmic indication (log scale).

As shown in FIG. 5, the IV characteristics of the magnetoresistive effect element MTJ are different between the P state and the AP state. Specifically, in FIG. 5, the IV characteristics of the magnetoresistive effect element MTJ in the P state are indicated by line L1, and the IV characteristics of the magnetoresistive effect element MTJ in the AP state are indicated by line L2.

To be more specific, in each of the cases of the P state and AP state, the flowing current I of the magnetoresistive effect element MTJ increases substantially linearly in accordance with an increase of the applied voltage V. As described above, the resistance value of the magnetoresistive effect element MTJ is lower in the P state than in the AP state. Thus, when the same voltage V is applied, the current flowing through the magnetoresistive effect element MTJ in the P state is greater than the current flowing through the magnetoresistive effect element MTJ in the AP state. Specifically, the line L1 is always plotted on the above side of the line L2 in FIG. 5.

It should be noted that when an excessive voltage V is applied to the magnetoresistive effect element MTJ, there is a possibility that the magnetoresistive effect element MTJ loses the function as the magnetoresistive effect element MTJ (the magnetoresistive effect element MTJ is destroyed) by dielectric breakdown of the tunnel barrier layer TB. Thus, it is preferable that an excessive voltage V is not applied to the magnetoresistive effect element MTJ. Concretely, for example, it is preferable that, for example, a voltage greater than 1.3 V is not applied to the magnetoresistive effect element MTJ (i.e. a voltage in a range of 0 V to 1.3 V is applied to the magnetoresistive effect element MTJ). It is more preferable that a voltage greater than 0.6 V is not applied to the magnetoresistive effect element MTJ (i.e. a voltage in a range of 0 V to 0.8 V is applied to the magnetoresistive effect element MTJ).

As indicated by line L3 in FIG. 5, the selector SEL has nonlinear IV characteristics. To be more specific, if the voltage V is gradually increased from 0 V and the voltage V reaches a threshold voltage Vth, a threshold current Ith flows through the selector SEL (point P1 in FIG. 5). However, the threshold current Ith is negligibly small, compared to the current at the time when the threshold voltage Vth is applied to the magnetoresistive effect element MTJ as a single unit. The threshold voltage Vth is, for example, 1.5 V, and the threshold current Ith is, for example, 1 μA. Thus, when the magnetoresistive effect element MTJ and selector SEL are coupled in series as in the memory cell MC shown in FIG. 2, the selector SEL functions as an insulator which shuts off current to the magnetoresistive effect element MTJ in the range of the voltage V which is increased from 0 V to the threshold voltage Vth.

If the current flowing through the selector SEL exceeds the threshold current Ith, a snap-back occurs in the selector SEL. The snap-back is a phenomenon in which, while the voltage drop amount is decreasing from the threshold voltage Vth, a current greater than the threshold current Ith flows. If the current flowing through the selector SEL reaches a hold current Ihold (>Ith), the voltage drop amount becomes a hold voltage Vhold (<Vth) (point P2 in FIG. 5).

If the voltage drop amount reaches the hold voltage Vhold after the occurrence of the snap-back, the voltage drop amount in the selector SEL remains substantially unchanged at the hold voltage Vhold, even if a current greater than the hold current Ihold flows. In this state in which the voltage drop amount in the selector SEL is regarded as being constant at the hold voltage Vhold irrespective of the current amount, the IV characteristics of the memory cell MC can be regarded as having a shape in which the IV characteristics of the selector SEL (the voltage drop amount is constant at Vhold) and the IV characteristics of the magnetoresistive effect element MTJ are added in the direction of the abscissa axis.

In FIG. 5, the IV characteristics of the memory cell MC, in which the magnetoresistive effect element MTJ and selector SEL having the above IV characteristics are coupled in series, are represented by dotted lines L4 and L5. Note that the dotted line L4 corresponds to the IV characteristics in the case in which the selector SEL is coupled in series to the magnetoresistive effect element MTJ in the P state, and the dotted line L5 corresponds to the IV characteristics in the case in which the selector SEL is coupled in series to the magnetoresistive effect element MTJ in the AP state.

In the description below, a case is assumed in which a constant voltage is applied to the memory cell MC. In this case, as indicated by dotted lines L4 and L5, a voltage drop by the selector SEL is dominant until the voltage applied to the memory cell MC reaches the threshold voltage Vth, and substantially no current flows through the magnetoresistive effect element MTJ. If the voltage applied to the memory cell MC exceeds the threshold voltage Vth (i.e. if a snap-back occurs in the selector SEL), the IV characteristics of the memory cell MC transition from the state of point P1 to the state of a region P3 in FIG. 5. Thus, if the snap-back occurs, a voltage (Vth-Vhold), which corresponds to at least a difference between the threshold voltage Vth and hold voltage Vhold, is applied to the magnetoresistive effect element MTJ.

As described above, it is preferable that a voltage of a magnitude, which may cause dielectric breakdown in the tunnel barrier layer TB, is not applied to the magnetoresistive effect element MTJ. It is thus preferable that the above-described voltage (Vth-Vhold) is less than the voltage of the magnitude which may cause dielectric breakdown in the tunnel barrier layer TB. The titanium-doped germanium telluride (TiGeTe) has a value of voltage (Vth-Vhold) which is about 0.5 V to 0.6 V, and satisfies the above-described condition.

In addition to the above standpoint of protection of the magnetoresistive effect element MTJ, in order to prevent leak current to a memory cell MC that is not the target of write or read in the selection operation of the memory cell MC which will be described later, it is preferable that the threshold voltage Vth is 1.0 V to 2.0 V. The titanium-doped germanium telluride (TiGeTe) has a value of threshold voltage Vth which is about 1.5 V, and satisfies the above-described condition.

1.2 Selection Operation of Memory Cell

Next, the selection operation of the memory cell in the magnetic storage device according to the first embodiment will be described. In the description below, the memory cell MC that is the target of write or read, i.e. the memory cell MC associated with the pair of the selected word line WL and selected bit line BL, is referred to as "selected memory cell MC" (or "memory cell MC in the selected state").

Figure 6:
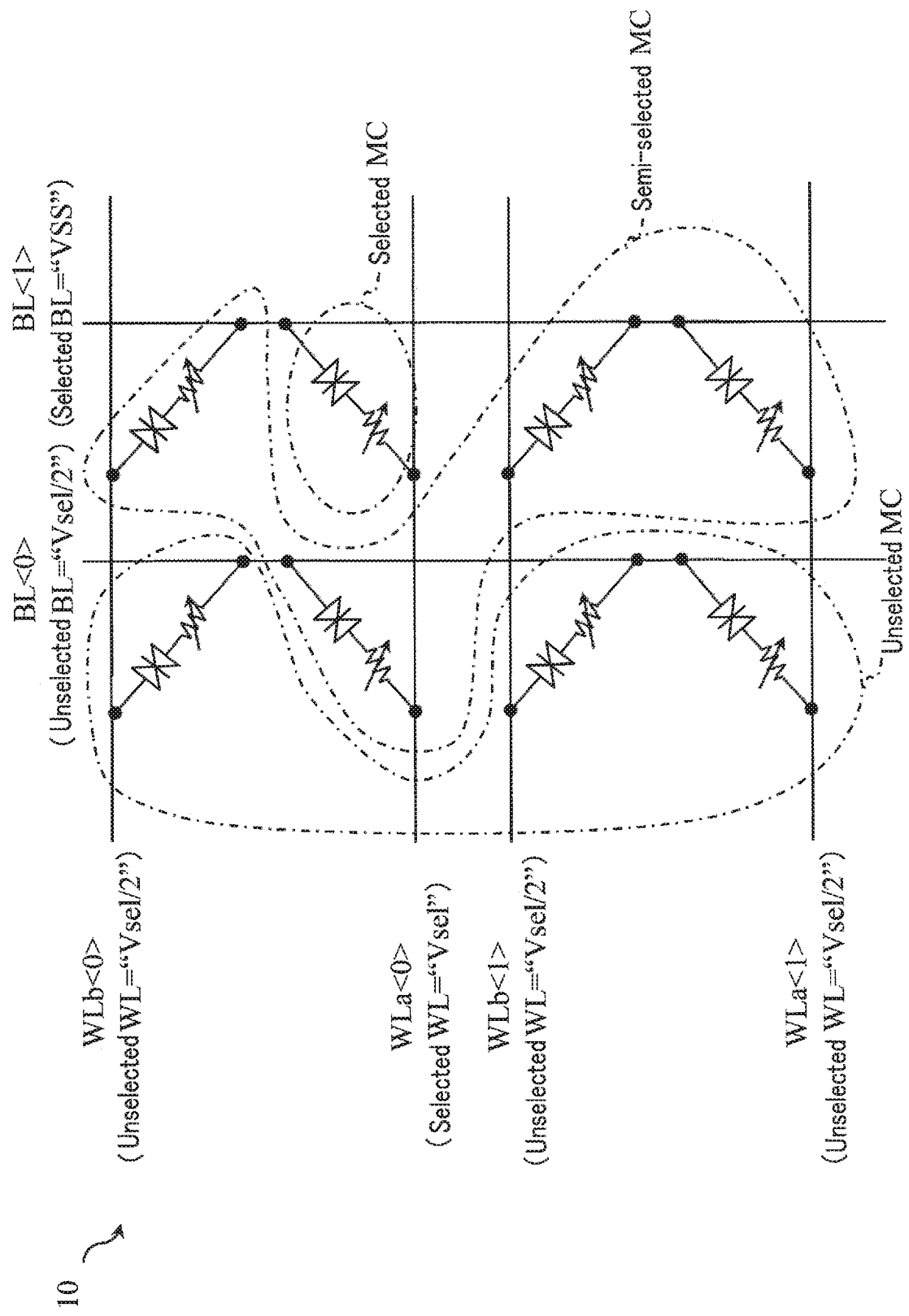
FIG. 6 is a schematic diagram for describing a selection operation of the memory cell of the magnetic storage device according to the first embodiment.

FIG. 6 is a schematic diagram for describing the outline of the selection operation of the memory cell of the magnetic storage device according to the first embodiment. In the example of FIG. 6, eight memory cells MC, which are coupled between one of the bit lines BL<0> and BL<1>, and one of the word lines WLa<0>, WLb<0>, WLa<1> and WLb<1>, are illustrated.

As shown in FIG. 6, the row selection circuit 11 and column selection circuit 12 execute control such that a voltage Vsel is applied between the selected word line WL and selected bit line BL. The Vsel is a voltage higher than the threshold voltage Vth of the selector SEL. In the example of FIG. 6, for instance, a case is illustrated in which a voltage Vsel is applied to the selected word line WLa<0> and a voltage VSS is applied to the selected bit line BL<1>. The voltage VSS is a ground voltage and is, for example, 0 V.

The voltage Vsel is applied to the selected memory cell MC. Thus, a voltage that is equal to or higher than the threshold voltage Vth is applied to the selector SEL in the selected memory cell MC. Thereby, the selector SEL in the selected memory cell MC is turned to the ON state, and a write current or a read current can be passed through the magnetoresistive effect element MTJ in the selected memory cell MC. Note that when the direction of the current that is passed is to be reversed, the row selection circuit 11 and column selection circuit 12 execute such control as to apply the voltage Vsel to the selected bit line BL<1> and to apply the voltage VSS to the selected word line WLa<0>.

In addition, the row selection circuit 11 and column selection circuit 12 execute such control as to supply a voltage Vsel/2 to unselected word lines WL and an unselected bit line BL. The voltage Vsel/2 is a voltage which is lower than the threshold voltage Vth which sets the selector SEL in the ON state. In the example of FIG. 6, for instance, a case is illustrated in which the voltage Vsel/2 is applied to the word lines WLb<0>, WLa<1> and WLb<1>, and to the hit line BL<0>. The memory cells MC which are disposed between the selected bit line BL and unselected word lines WL, and the memory cell MC which is disposed between the selected word line WL and unselected bit line EL, are referred as "semi-selected memory cells MC" (or "memory cells MC in a semi-selected state"). The voltage Vsel/2 is applied to the semi-selected memory cells MC. Thereby, a voltage lower than the threshold voltage Vth is applied to the selector SEL in the semi-selected memory cells MC. Thus, the selector SEL in each of the semi-selected memory cells MC is set in the OFF state, and the write current or read current can be prevented from flowing through the magnetoresistive effect element. MTJ in each of the semi-selected memory cells MC.

Besides, the memory cells MC disposed between the unselected bit line BL and unselected word lines WL are referred to as "unselected memory cells MC" (or "memory cells MC in an unselected state"). Since the voltage Vsel/2 is applied to each of the unselected bit line BL and unselected word lines WL, no voltage drop occurs in the unselected memory cells MC. Thus, the selector SEL in each of the unselected memory cells MC is set in the OFF state, and the write current or read current can be prevented from flowing through the magnetoresistive effect element MTJ in each of the unselected memory cells MC.

1.3 Manufacturing Method of Memory Cells

Next, a manufacturing method of memory cells of the magnetic storage device according to the first embodiment will be described.

Figure 7:
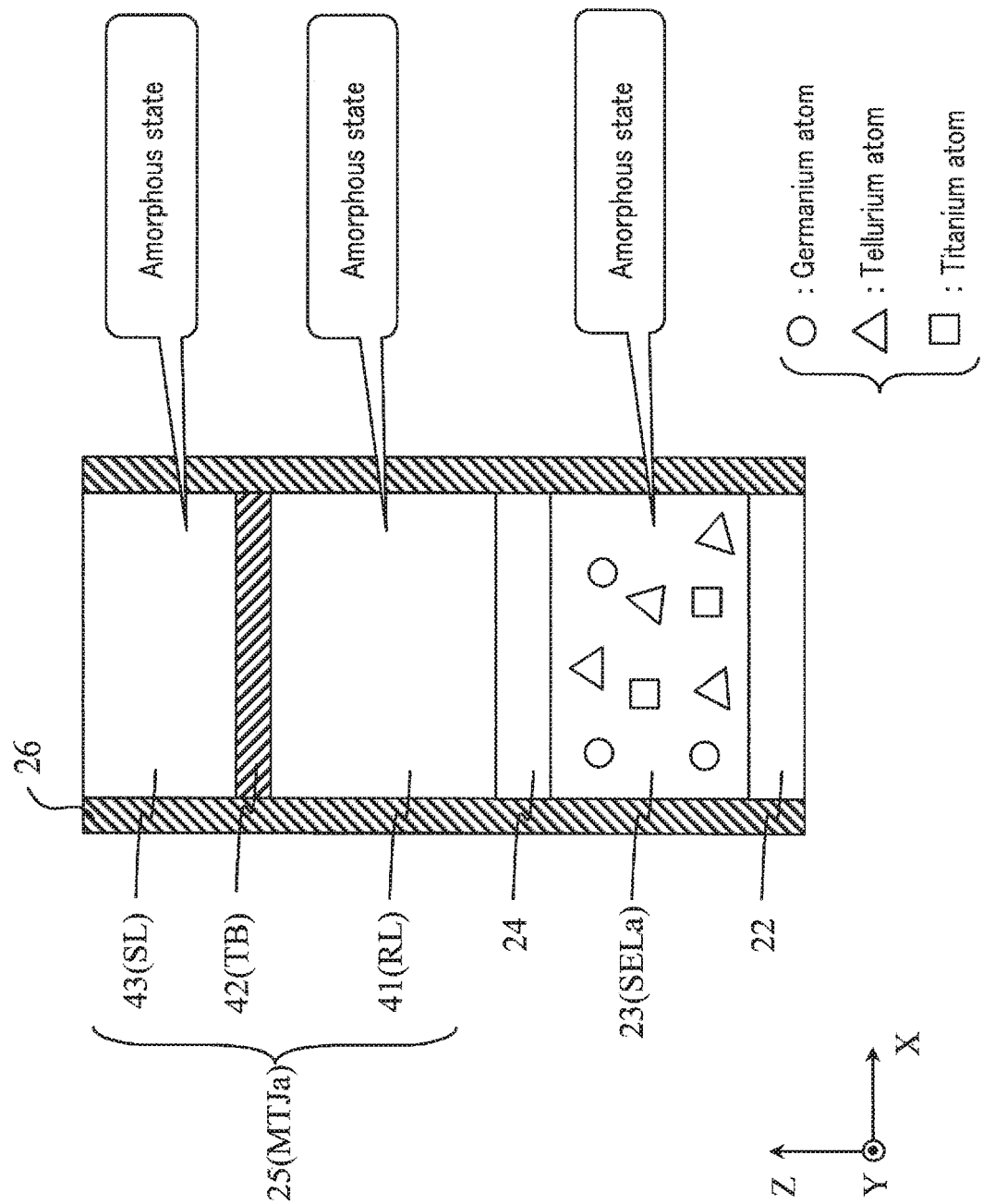
FIG. 7 is a schematic diagram for describing a manufacturing method of the memory cell of the magnetic storage device according to the first embodiment.
Figure 8:
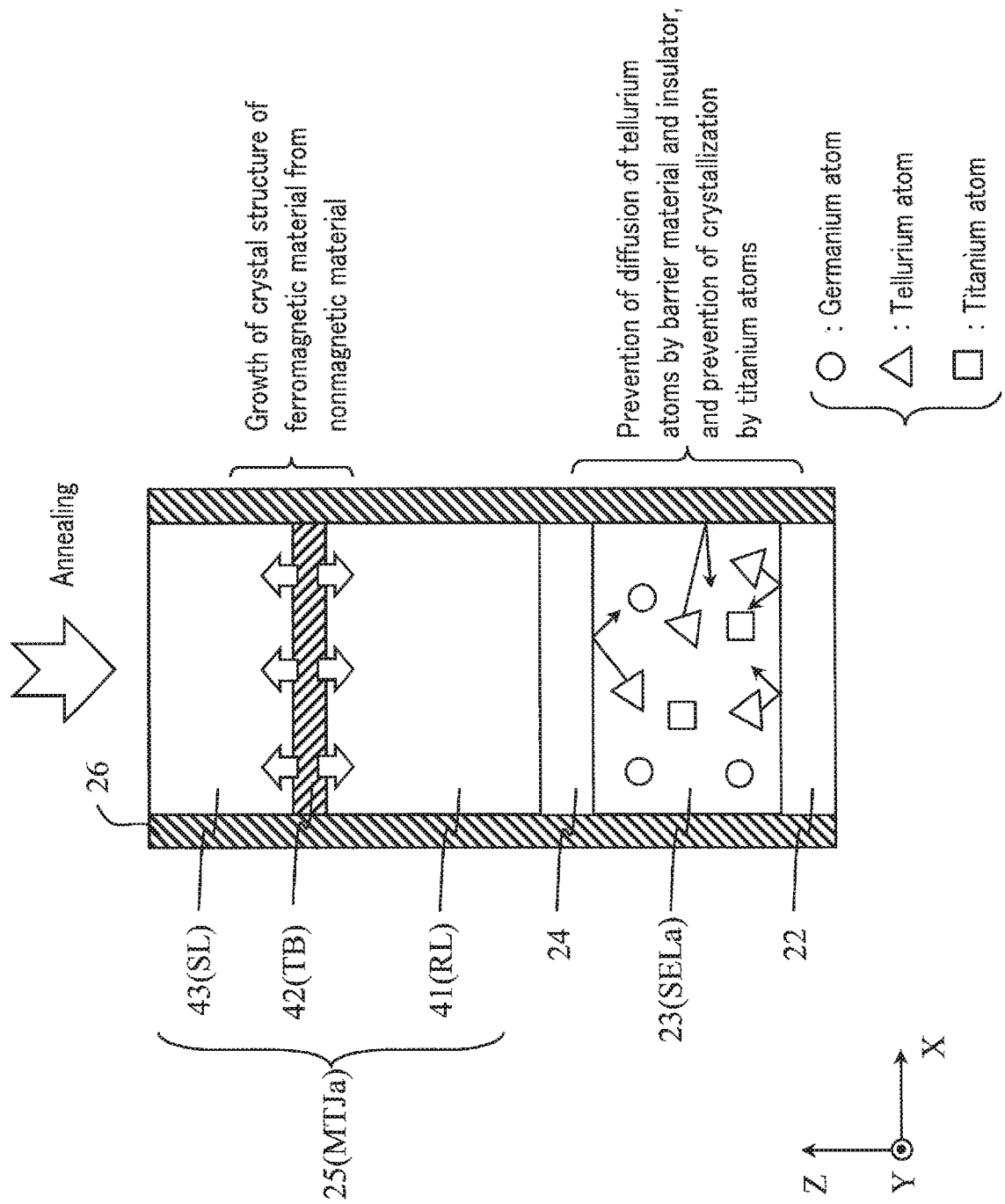
FIG. 8 is a schematic diagram for describing the manufacturing method of the memory cell of the magnetic storage device according to the first embodiment.
Figure 9:
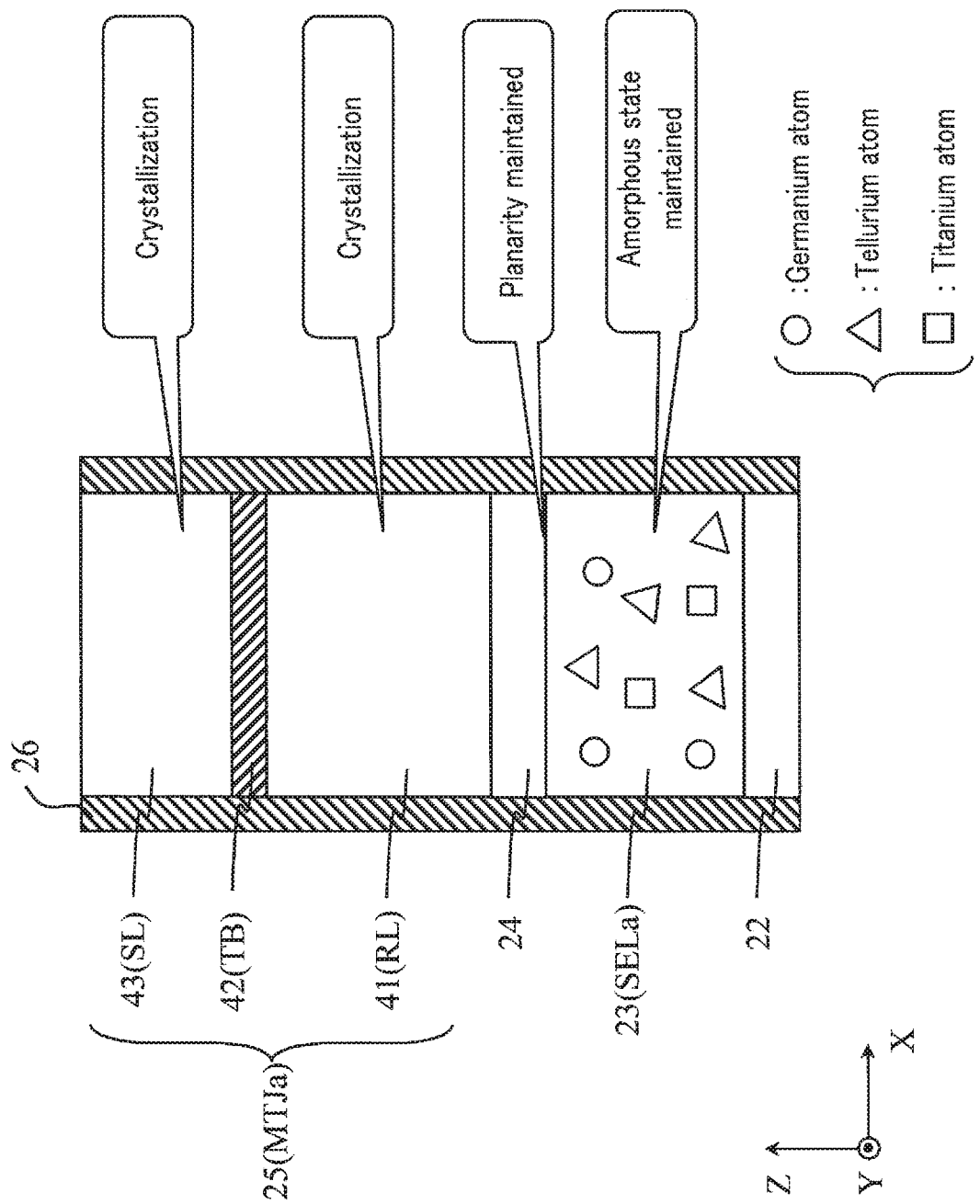
FIG. 9 is a schematic diagram for describing the manufacturing method of the memory cell of the magnetic storage device according to the first embodiment.

FIG. 7 to FIG. 10 are schematic diagrams for describing the manufacturing method of memory cells of the magnetic storage device according to the first embodiment. In FIG. 7 to FIG. 10, for the purpose of simple description, the memory cell MCa is illustrated as an example of memory cells MC. FIG. 7 illustrates a state after materials that are to function as the selector SEL and magnetoresistive effect element MTJ were stacked, and before an annealing process is performed. FIG. 8 illustrates a state in which the annealing process is being performed after the state of FIG. 7. FIG. 9 illustrates a state in which the annealing process has been finished after the state of FIG. 8. FIG. 10 illustrates a state in which the function of the magnetoresistive effect element MTJ is disposed by a magnetic initialization process. Hereinafter, the respective states of FIG. 7 to FIG. 10 will be successively described.

As shown in FIG. 7, a barrier material 22, an element 23, a barrier material 24, a ferromagnetic material 41, a nonmagnetic material 42 and a ferromagnetic material 43 are stacked in the named order, and an insulator 26 is disposed on the side surface of each layer. Excluding portions that are to function as the memory cell MC, the stacked layers are removed by etching which uses, for example, an ion beam. As described above, the ferromagnetic material 41, nonmagnetic material 42 and ferromagnetic material 43 are stacked above the element 23. Thereby, the ease in etching can be improved, compared to the case in which the ferromagnetic material 41, nonmagnetic material 42 and ferromagnetic material 43 are stacked below the element 23. The element 23 includes titanium-doped germanium telluride (TiGeTe) and has an amorphous structure. The ferromagnetic material 41, nonmagnetic material 42 and ferromagnetic material 43 are a set of materials that are to function as the magnetoresistive effect element MTJa, and the ferromagnetic materials 41 and 43 have amorphous structures.

Note that in FIG. 7 onwards, for the purpose of convenience, germanium atoms (Ge) included in the element 23 are expressed by "○", tellurium atoms (Te) are expressed by "Δ", and titanium atoms (Ti) are expressed by "□".

Next, as shown in FIG. 8, the annealing process is performed on the layers stacked in FIG. 7. Concretely, heat (e.g. 300° C. or above, preferably 350° C. or above) is applied to each layer for a predetermined period from the outside. Thereby, the ferromagnetic materials 41 and 43 are converted from the amorphous state to crystalline material. Here, the nonmagnetic material 42 can function to control alignment of crystalline structures of the ferromagnetic materials 41 and 43. Specifically, the ferromagnetic materials 41 and 43 can grow crystalline structures by using the nonmagnetic material 42 as a seed. Thereby, the ferromagnetic materials 41 and 43 are aligned in the same crystal plane as the crystal plane of the nonmagnetic material 42.

During the above annealing process, the element 23 is heated like the ferromagnetic materials 41 and 43, and there is a possibility that the germanium telluride (GeTe) is crystallized. However, since titanium (Ti) is doped in the element 23, the crystallization of the germanium telluride (GeTe) can be suppressed.

In addition, of the atoms included in the element 23, tellurium atoms (Te) tend to easily diffuse into other layers in a high-temperature environment, and can evaporate ultimately. However, as described above, around the element 23, the barrier material 24 is disposed on the upper surface of the element 23, the barrier material 22 is disposed on the lower surface of the element 23, and the insulator 26 is disposed on the side surface of the element 23. The barrier materials 22 and 24 and the insulator 26 have functions to prevent diffusion of tellurium atoms (Te). Thereby, it is possible to prevent tellurium atoms (Te) from being diffused from the element 23 during the annealing process.

Next, as shown in FIG. 9, the annealing process in FIG. 8 is finished. By the progress of crystallization, the characteristics of the ferromagnetic materials 41 and 43, such as interface magnetic anisotropy, are improved. On the other hand, in the element 23, the tellurium atoms (Te) are not lost, and the amorphous state is maintained. Moreover, since the titanium atoms (Ti) are doped in the element 23, the element 23 has robustness to heat which is applied at the time of the annealing process. Thereby, the planarity of the layer at the interface can be maintained. Thus, the element 23 can maintain the function of the selector SELa.

Next, as shown in FIG. 10, the magnetic initialization process is performed on each layer, for which the annealing process has been finished in FIG. 9. Specifically, a magnetic field (e.g. a magnetic field of such a magnitude as to be able to magnetize the ferromagnetic material 41) is applied from the outside to each layer in a predetermined direction (the Z direction in the example of FIG. 10). Thereby, the ferromagnetic materials 41 and 43 are magnetized. Thus, the ferromagnetic material 41, nonmagnetic material 42 and ferromagnetic material 43 enter such a state as to be able to function as the magnetoresistive effect element MTJa.

By the above, the manufacture of the memory cells MC is completed.

Note that when memory cells MC are stacked in the Z direction, the order of stacking of the selector SEL and magnetoresistive effect element MTJ is set to be identical between the upper-layer memory cell MCb and lower-layer memory cell MCa, as shown in FIG. 3. Thereby, the ease in manufacture can be improved.

1.4 Advantageous Effects of the Present Embodiment

According to the first embodiment, the integration density of cells can be improved. The advantageous effects will be described below.

The memory cell MC is configured such that the magnetoresistive effect element MTJ and selector SEL are coupled in series. Thereby, a select gate line, which is required when a select transistor is used, is made needless, and the magnetoresistive effect element MTJ and selector SEL can be stacked in the Z direction. Thus, the memory cell MC can be disposed at a region where the bit line BL and word line WL cross, and a cross-point structure, which can realize high integration density of 4F2, can be constituted. In addition, when the memory cells MC are stacked in the Z direction, the order of stacking of the selector SEL and magnetoresistive effect element MTJ is set to be identical between the upper-layer memory cell MCb and lower-layer memory cell MCa, as shown in FIG. 3. Thereby, the ease in manufacture can be improved.

Figure 11:
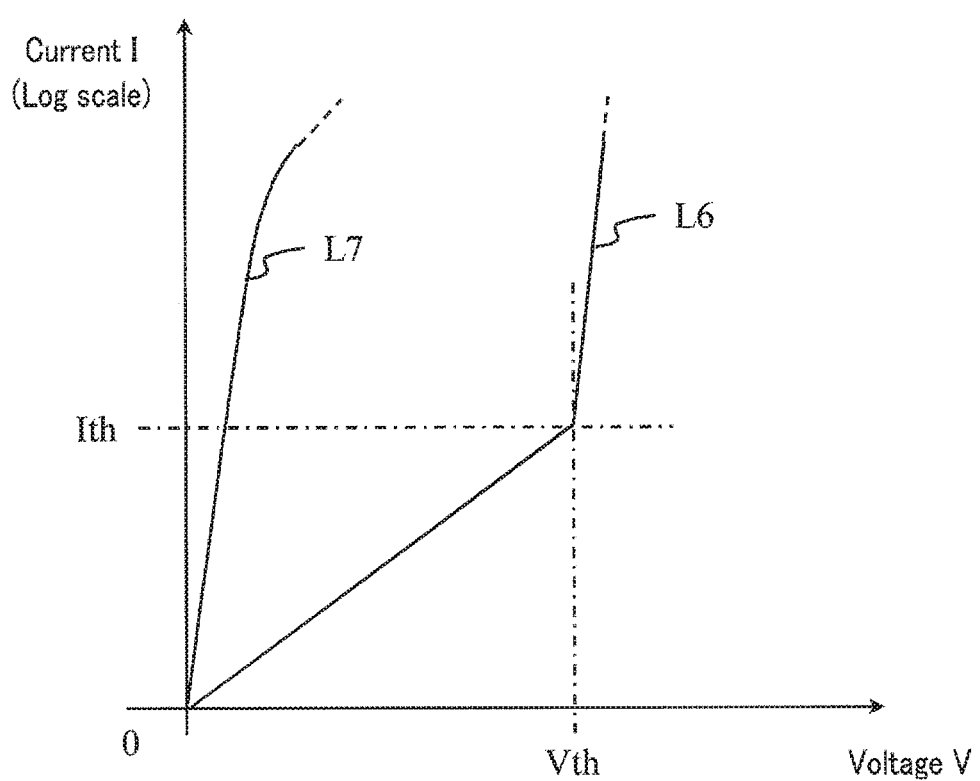
FIG. 11 is a diagram for describing characteristics after an annealing process of a selector of the magnetic storage device according to the first embodiment.

Besides, the selector SEL includes germanium (Ge), tellurium (Te) and titanium (Ti). Thereby, the selector SEL can have characteristics which are applicable to the magnetoresistive effect element MTJ. Referring to FIG. 11, a supplementary description is given of these characteristics.

FIG. 11 is a diagram for describing the characteristics of the selector which is used in the magnetic storage device according to the first embodiment. In FIG. 11, like FIG. 5, the abscissa axis indicates voltage V and the ordinate axis indicates current I. FIG. 11 shows IV characteristics of the selector SEL after heat (e.g. heat of 300° C.) corresponding to the annealing process has been applied. In FIG. 11, IV characteristics of the selector SEL including titanium-doped germanium telluride (TiGeTe) are indicated by line L6, and IV characteristics of the selector EEL including germanium telluride (GeTe) without titanium (Ti) are indicated by line L7.

As shown in FIG. 11, in the case of the titanium-doped germanium telluride (TiGeTe), even after the annealing process, only a current less than a threshold current Ith (e.g. 5 μA) flows in a state in which a voltage less than a threshold voltage Vth (e.g. 1.0 V to 2.0 V) is applied. Thus, the titanium-doped germanium telluride (TiGeTe) functions as an insulator. If the applied voltage V exceeds the threshold voltage Vth, a current sharply increases, and the titanium-doped germanium telluride (TiGeTe) functions as a conductor. In this manner, even after the annealing process, the titanium-doped germanium telluride (TiGeTe) can keep the same characteristics as the IV characteristics described with reference to FIG. 5.

On the other hand, in the case of the germanium telluride (GeTe) which is not doped with titanium (Ti), after the annealing process, a large current exceeding the threshold current Ith flows before the applied voltage reaches the threshold voltage Vth. Specifically, the germanium telluride (GeTe), which is not doped with titanium (Ti), may lose the function of the selector by the annealing process.

According to the first embodiment, the selector SEL includes germanium (Ge) at an atomic ratio of 5 at % to 30 at %. Thereby, a two-terminal switching element can be fabricated, which has a threshold voltage Vth of 1.0 V to 2.0 V and has a variation amount of 0 V to 1.3 V of a voltage drop at a time of a snap-back. Thus, even when the selector SEL is coupled in series to the magnetoresistive effect element MTJ, it is possible to suppress the application of a voltage with a magnitude which can destroy the magnetoresistive effect element MTJ at a time of ON/OFF switching of the selector SEL.

Additionally, as described above, in the selector SEL, titanium (Ti) is doped in germanium tellurium (GeTe). In particular, the selector SEL includes titanium (Ti) at an atomic ratio of 2 at % to 10 at %. Thereby, even if the heat of about 300° C. is applied, crystallization of tellurium (Te) and germanium (Ge) can be suppressed. Thus, even after performing the annealing process which is necessary for crystallizing the magnetoresistive effect element MTJ, the selector SEL can keep the amorphous state. Moreover, since the planarity of the film is maintained even after the annealing process, the function of the selector SEL can be maintained even if the selector SEL is repeatedly used. Therefore, a memory cell MC, which can operate in a state in which the selector SEL and magnetoresistive effect element MTJ do not lose their functions, can be fabricated.

Additionally, the barrier materials are disposed on the upper surface and lower surface of the selector SEL. The barrier materials include, for example, carbon (C). Besides, the insulator is disposed on the side surface of the selector SEL. The insulator includes, for example, silicon nitride (SiN). Thereby, at the time of the annealing process, it is possible to prevent tellurium atoms (Te) from diffusing and evaporating from the selector SEL. Therefore, it is possible to further suppress the loss of the function of the selector SEL after the annealing process Additionally, in the same memory cell MC, the selector SEL is disposed below the magnetoresistive effect element MTJ. Thereby, the ease in manufacture can be improved when layers that are to function as the memory cell MC are stacked and then other portions are etched.

2. Second Embodiment

Next, a magnetic storage device according to a second embodiment will be described. In the first embodiment, the case is described in which the barrier material and selector are divided into a plurality of barrier materials and selectors along the word line. The second embodiment differs from the first embodiment in that the barrier material and selector have the same shape as the word line or bit line existing immediately below, and selectors of a plurality of memory cells, which are commonly coupled to the same word line or bit line, are included in one physically continuous material (TiGeTe). Hereinafter, the different points from the first embodiment will mainly be described.

2.1 Configuration of Memory Cell Array

FIG. 12 is a cross-sectional view for describing the configuration of the memory cell array of the magnetic storage device according to the second embodiment. FIG. 12 corresponds to FIG. 3 which is described in the first embodiment.

As shown in FIG. 12, for example, a plurality of conductors 21 functioning as word lines WLa are disposed on the upper portion of the semiconductor substrate 20. The conductors 21 are arranged, for example, in the Y direction, and extend in the X direction. On that region of the semiconductor substrate 20, on the conductors 21 are not disposed, an insulator (not shown), for example, is disposed up to the height of the conductors 21.

A barrier material 22 which prevents diffusion of the material included in the selector SELa, an element 23 functioning as the selector SELa, and a barrier material 24 which prevents diffusion of the material included in the selector SELa, are stacked in the named order along the upper portion of each conductor 21. Specifically, the barrier material 22, element 23 and barrier material 24 extend on the conductor 21 in the X direction, like the conductor 21.

A plurality of elements 25 functioning as magnetoresistive effect element MTJa are disposed on the upper portion of the barrier material 24 which extends in the X direction.

An insulator 26, for example, is disposed on that surface of the upper portion of the barrier material 24, on which the elements 25 are not disposed, and on the side surfaces of the barrier material 22, element 23, barrier material 24 and element 25 which are stacked in the named order in the Z direction. For example, an insulator 2 is disposed on the insulator 26 up to the height of the element 25.

A conductor 28 functioning as the bit line BL is disposed on the upper portion of each of the elements 25. For example, the conductors 28 are arranged in the X direction, and extend in the Y direction. Each of the conductors 28 arranged in the X direction is commonly coupled to the elements 25 (not shown) arranged in the Y direction. For example, on those regions of the upper surfaces of the insulators 26 and 27, on which the conductors 28 are not disposed, for example, an insulator 29 is disposed up to the height of the conductors 28.

A barrier material 30 which prevents diffusion of the material included in the selector SELb, an element 31 functioning as the selector SELb, and a barrier material 32 which prevents diffusion of the material included in the selector SELb, are stacked in the named order along the upper portion of each conductor 28. Specifically, the barrier material 30, element 31 and barrier material 32 extend on the conductor 28 in the Y direction, like the conductor 28.

A plurality of elements 33 functioning as magnetoresistive effect elements MTJb are disposed on the upper portions of each of the barrier materials 32 extending in the Y direction.

For example, an insulator 34 is disposed on that surface of the upper portion of the conductor 29, and side surfaces of the barrier material 30, element 31, barrier material 32 and element 33 which are stacked in the named order in the Z direction. For example, an insulator 35 is disposed on the insulator 34 up to the height of the elements 33.

A conductor 36 functioning as the word line WLb is disposed on the upper portion of each of the elements 33. For example, the conductors 36 are arranged in the Y direction, and extend in the X direction. Each of the conductors 36 arranged in the Y direction is commonly coupled to the elements 33 arranged in the X direction. For example, on those regions of the upper surfaces of the insulators 34 and 35, on which the conductors 36 are not disposed, for example, an insulator (not shown) is disposed up to the height of the conductors 36.

By the above configuration, the memory cell array 10 has a structure (stacked cross-point structure) in which cross-point structures, each being able to select one memory cell MC by a pair of one bit line BL and one word line WL, are stacked in the Z direction.

2.2 Advantageous Effects of the Present Embodiment

According to the second embodiment, in lower layers, the element 23 has the same shape as the conductor 21 in the XY plane. Specifically, the selectors SELa in the memory cells MCa, which are commonly coupled on the word line WLa, are composed of a portion of the physically continuous material (TiGeTe). Thereby, it is possible to avoid processing the barrier material 22, element 23 and barrier material 24 in the same pillar shape as the element 25. Therefore, the ease in manufacture is improved, and the yield of magnetic storage devices 1 can be increased.

Similarly, in upper layers, the element 31 has the same shape as the conductor 28 in the YY plane. Specifically, the selectors SELb in the memory cells MCb, which are commonly coupled on the bit line BL, are composed of a portion of the physically continuous material (TiGeTe). Thereby, it is possible to avoid processing the barrier material 30, element 31 and barrier material 32 in the same pillar shape as the element 33. Therefore, the ease in manufacture is improved, and the yield of magnetic storage devices 1 can be increased.

3. Third Embodiment

Next, a magnetic storage device according to a third embodiment will be described. The third embodiment differs from the first embodiment in that the barrier material and selector are formed in a single plate shape, and selectors of a plurality of memory cells formed in lower layers, or selectors of a plurality of memory cells formed in upper layers, are included in one physically continuous material (TiGeTe). Hereinafter, the different points from the first embodiment will mainly be described.

3.1 Configuration of Magnetoresistive Effect Element

FIG. 13 is a cross-sectional view for describing the configuration of the memory cell array of the magnetic storage device according to the third embodiment. FIG. 13 corresponds to FIG. 3 which is described in the first embodiment.

As shown in FIG. 13, for example, a plurality of conductors 21 functioning as word lines WLa are disposed on the upper portion of the semiconductor substrate 20. The conductors are arranged, for example, in the Y direction, and extend in the X direction. On that region of the semiconductor substrate 20, on the conductors 21 are not disposed, an insulator (not shown), for example, is disposed up to the height of the conductors 21.

A barrier material 22 which prevents diffusion of the material included in the selector SELa, an element 23 functioning as the selector SELa, and a barrier material 24 which prevents diffusion of the material included in the selector SELa, are stacked in the named order on the conductors 21 and the insulator (not shown). Specifically, the barrier material 22, element 23 and barrier material 24 extend on the entire surfaces of the conductors 21 and the insulator (not shown).

A plurality of elements 25 functioning as magnetoresistive effect elements MTJa are disposed above the conductors 21 extending in the X direction.

An insulator 26, for example, is disposed on the upper portion of the barrier material 24 and on the side surface of the element 25. For example, an insulator 27 is disposed on the insulator 26 up to the height of the elements 25.

A conductor 28 functioning as the bit line BL is disposed on the upper portion of each of the elements 25. For example, the conductors 28 are arranged in the X direction, and extend in the Y direction. Each of the conductors 28 arranged in the X direction is commonly coupled to the elements 25 (not shown) arranged in the Y direction. For example, on those regions of the upper surfaces of the insulators 26 and 27, on which the conductors 28 are not disposed, for example, an insulator 29 is disposed up to the height of the conductors 28.

A barrier material 30 which prevents diffusion of the material included in the selector SELb, an element 31 functioning as the selector SELb, and a barrier material 32 which prevents diffusion of the material included in the selector SELb, are stacked in the named order on the upper portions of the conductors 28 and insulators 29. Specifically, the barrier material 30, element 31 and barrier material 32 are disposed on the entire surfaces of the conductors 28 and insulators 29.

A plurality of elements 33 functioning as magnetoresistive effect elements MTJb are disposed above the conductors 28 extending in the Y direction.

For example, an insulator 34 is disposed on the upper portion of the barrier material 32 and on the side surface of the element 33. For example, an insulator 35 is disposed on the insulator 34 up to the height of the elements 33.

A conductor 36 functioning as the word line WLb is disposed on the upper portion of each of the elements 33. For example, the conductors 36 are arranged in the Y direction, and extend in the X direction. Each of the conductors 36 arranged in the Y direction is commonly coupled to the elements 33 arranged in the X direction. For example, on those regions of the upper surfaces of the insulators 34 and 35, on which the conductors 36 are not disposed, for example, an insulator (not shown) is disposed up to the height of the conductors 36.

By the above configuration, the memory cell array 10 has a structure (stacked cross-point structure) in which cross-point structures, each being able to select one memory cell MC by a pair of one bit line BL and one word line WL, are stacked in the Z direction.

3.2 Advantageous Effects of the Present Embodiment

According to the third embodiment, in lower layers, the element 23 is disposed over the entire surface in the XY plane. Specifically, the selectors SELa in all memory cells MCa, which correspond to the word lines WLa disposed in lower layers, are composed of a portion. of the physically continuous material (TiGeTe). Thereby, it is possible to avoid processing the barrier material 22, element 23 and barrier material 24 in the same pillar shape as the element 25. Therefore, the ease in manufacture is improved, and the yield of magnetic storage devices 1 can be increased.

Similarly, in upper layers, the element 31 is disposed over the entire surface in the XY plane. Specifically, the selectors SELb in all memory cells MCb, which correspond to the word lines WLb disposed. In upper layers, are composed of a portion of the physically continuous material (TiGeTe). Thereby, it is possible to avoid processing the barrier material 30, element 31 and barrier material 32 in the same pillar shape as the element 33. Therefore, the ease in manufacture is improved, and the yield of magnetic storage devices 1 can be increased.

4. Others

Besides, the above-described embodiments and modifications can be modified, for example, as described below.

In the memory cells MC described in the above embodiments and modifications, the selector SEL is disposed below (semiconductor substrate 20 side from) the magnetoresistive effect element MTJ, but the configuration is not limited to this. For example, the selector SEL may be disposed above (conductor 36 side from) the magnetoresistive effect element MTJ.

In addition, the magnetoresistive effect element MTJ described in each of the above embodiments and modifications is of a top-free type in which the storage layer SL is disposed above the reference layer RL, but the configuration is not limited to this. For example, the magnetoresistive effect element MTJ may similarly be applied to a bottom-free type in which the storage layer SL is disposed on the semiconductor substrate 20 side of the reference layer RL (i.e. the storage layer SL is disposed below the reference layer RL).

Furthermore, although the magnetoresistive effect element MTJ described in each of the above embodiments and modifications is a perpendicular magnetization MTJ, the magnetoresistive effect element MTJ may be a horizontal magnetization MTJ element which has a horizontal magnetic anisotropy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic storage device comprising:
a first memory cell including a magnetoresistive effect element and a selector, the selector including titanium (Ti), germanium (Ge) and tellurium (Te).

2. The device of claim 1, wherein the selector includes the germanium (Ge) at an atomic ratio of 5 at % to 30 at %.

3. The device of claim 2, wherein the selector includes the germanium (Ge) at an atomic ratio of 10 at % to 20 at %.

4. The device of claim 3, wherein the selector includes the titanium (Ti) at an atomic ratio of 2 at % to 10 at %.

5. The device of claim 4, wherein the selector includes the titanium (Ti) at an atomic ratio of 4 at % to 8 at %.

6. The device of claim 5, wherein the selector has an amorphous structure.

7. The device of claim 1, wherein the selector includes a two-terminal switching element and has a threshold voltage of 1.0 V to 2.0 V.

8. The device of claim 1, wherein:
the selector includes a two-terminal switching element, and
a variation amount of a voltage drop of the selector at a time when a snap-back occurs in the selector is 0 V to 1.3 V.

9. The device of claim 1, wherein the first memory cell further includes a first barrier material disposed on a lower surface of the selector, and a second barrier material disposed on an upper surface of the selector.

10. The device of claim 9, wherein the first barrier material and the second barrier material include carbon (C).

11. The device of claim 1, wherein the first memory cell further includes an insulator disposed on a side surface of the selector.

12. The device of claim 11, wherein the insulator includes silicon nitride (SiN).

13. The device of claim 1, wherein the selector is disposed below the magnetoresistive effect element.

14. The device of claim 13, further comprising a second memory cell including another magnetoresistive effect element and another selector,
wherein:
the first memory cell is configured to be capable of electrically connecting a first conductor and a second conductor,
the second memory cell is configured to be capable of electrically connecting the second conductor and a third conductor, and
the second memory cell is disposed above the first memory cell.

15. The device of claim 1, further comprising a second memory cell including another magnetoresistive effect element and another selector and being disposed in a same layer as the first memory cell,
wherein:
the first memory cell is configured to be capable of electrically connecting a first conductor and a second conductor,
the second memory cell is configured to be capable of electrically connecting the first conductor and a third conductor, and
the selector of the first memory cell and the selector of the second memory cell are included in one physically continuous material.

16. The device of claim 15, further comprising a third memory cell including another magnetoresistive effect element and another selector and being disposed in the same layer as the first memory cell and the second memory cell,
wherein:
the third memory cell is configured to be capable of electrically connecting a fourth conductor and the second conductor, and
the selector of the first memory cell, the selector of the second memory cell, and the selector of the third memory cell are included in one physically continuous material.

17. The device of claim 14, further comprising a controller configured to control write of data to the first memory cell,
wherein the controller is configured to apply, at a time of the write of the data to the first memory cell, a first voltage to the first conductor, a second voltage different from the first voltage to the second conductor, and a third voltage between the first voltage and the second voltage to the third conductor.

18. The device of claim 17, wherein a difference between the first voltage and the second voltage is greater than a threshold voltage of the selector, and a difference between the second voltage and the third voltage is less than the threshold voltage of the selector.

19. The device of claim 1, wherein the selector includes titanium-doped germanium telluride (TiGeTe).

20. The device of claim 1, further comprising a first conductor and a second conductor, wherein:

the magnetoresistive effect element and the selector are serially coupled between the first conductor and the second conductor;

the selector has a first resistance value in a case in which a first voltage that is lower than a threshold is applied between the first conductor and the second conductor; and the selector has a second resistance value that is smaller than the first resistance value in a case in which a second voltage that is higher than the threshold is applied between the first conductor and the second conductor.

* * * * *